United States Patent [19]

Son et al.

[11] Patent Number: 5,264,391
[45] Date of Patent: Nov. 23, 1993

[54] METHOD OF FORMING A SELF-ALIGNED CONTACT UTILIZING A POLYSILICON LAYER

[75] Inventors: Gon Son; Heon C. Lee, both of Kyungki; Soo S. Yoon, Seoul; Dong D. Lee, Seoul; Hae S. Park, Seoul; Sea C. Kim, Seoul, all of Rep. of Korea

[73] Assignee: Hyundai Electronics Industries Co., Ltd., Rep. of Korea

[21] Appl. No.: 842,549

[22] Filed: Feb. 27, 1992

[30] Foreign Application Priority Data

Feb. 28, 1991 [KR] Rep. of Korea .................. 91-3273

[51] Int. Cl.⁵ ........................................ H01L 21/441
[52] U.S. Cl. .................................. 437/195; 437/228; 437/235; 437/978
[58] Field of Search ............... 437/187, 195, 243, 235, 437/228, 978

[56] References Cited

U.S. PATENT DOCUMENTS

| | | | |
|---|---|---|---|
| 4,839,305 | 6/1989 | Brighton | 437/41 |
| 4,843,023 | 6/1989 | Chiu et al. | 437/34 |
| 4,902,639 | 2/1990 | Ford | 437/56 |
| 4,956,312 | 9/1990 | Van Laarhoven | 437/187 X |
| 4,997,790 | 3/1991 | Woo et al. | 437/195 |
| 5,114,879 | 5/1992 | Madan | 437/195 |

*Primary Examiner*—John S. Maples
*Attorney, Agent, or Firm*—Merchant Gould Smith Edell Welter & Schmidt

[57] ABSTRACT

A method of forming a contact region having an insulating layer which is etch protected, which includes sequentially depositing a gate oxide layer 2, a first conducting layer 3 for gate electrode, a first insulating layer 4 and a second conducting layer 5 on a silicon substrate 1. A portion of the second conducting layer 5 is etched to form an etch protective layer 5A. Portions of the etch protective layer 5A, the first insulating layer 4 and the first conducting layer 3 are sequentially etched to form separated gate electrodes 3a and 3b and separated etch protective layers 5a and 5b on the gate electrodes 3a and 3b, respectively and to expose a portion of the gate oxide layer 2 to define a source region 1A. A second insulating layer 6 is deposited on the entire surface of the resulting structure. The second insulating layer 6 is etched to form a spacer 6a on each of the side walls of the gate electrodes 3a and 3b and on the first insulating layer 4 and to expose the source region 1A. A third insulating layer 7 is deposited on the entire surface of the resulting structure. A contact region 10 is formed by selectively removing the third insulating layer 7 and the gate oxide layer 2 on the source region 1A and portions of the third insulating layer 7 on the etch protective layers 5a and 5b to form a contact region having an etch protected insulating layer.

10 Claims, 3 Drawing Sheets

METHOD OF FORMING A SELF-ALIGNED CONTACT UTILIZING A POLYSILICON LAYER

BACKGROUND OF INVENTION

1. Field of the Invention

This invention relates to a method of forming a self-aligned contact utilizing a polysilicon etch protectant layer in manufacturing a semiconductor device, and more particularly, to a method of forming a self-aligned contact by providing an etch protectant polysilicon layer as a protective layer to prevent an insulating layer formed on gate electrode from being undesirably etched during the self-aligned contact process.

2. Information Disclosure Statement

Generally, as the integrity of the semiconductor device increases, the area of the unit cell of the semiconductor device decreases which results in a decrease in the processing area available for manufacturing the device. To overcome this problem, during the bit line contact process of the semiconductor device, a self-aligned contact process is used in forming a contact region in the space between word lines, that is, between the gate electrodes in order to make the most of the available space.

However, in the self-aligned contact process as mentioned above, an insulating layer formed on the gate electrode deteriorates during the bit line contact process, which undesirably results in current leakage between the bit line and the word line. In order to prevent this problem, either a polysilicon oxide layer or a nitride layer is utilized as an etch barrier layer for the insulating layer formed on the gate electrode.

Nevertheless, even though a nitride layer or a polysilicon oxide layer is applied as an etch barrier layer according to the prior art, since the etching selectivity of the insulating layer, which has been deposited on the etch barrier layer and is to be removed during the bit line contact process, is the same as that of the etch barrier layer, it cannot properly function during the over etching process of the resulting structure after the main etching process of the insulating layer deposited on the entire surface of the resulting structure is performed.

Therefore, it is an object of the present invention to solve the problem set forth above and to provide a method of forming a self-aligned contact utilizing a polysilicon layer as a protective layer for preventing undesirable etching of the insulating layer formed on the gate electrode, during the self-aligned contact etching process.

The preceding object should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The method of forming a self-aligned contact utilizing a protective polysilicon layer of the present invention is defined by the claims with a specific embodiment shown in the attached drawings. For the purpose of summarizing the invention, the invention relates a method of forming a contact region having an insulating layer which is etch protected. The method comprises sequentially depositing a gate oxide layer 2, a first conducting layer 3 for gate electrode and a first insulating layer 4 and a second conducting layer 5 on a silicon substrate 1. A portion of the second conducting layer 5 is etched to form an etch protective layer 5A over a portion of the first insulating layer. Portions of the etch protective layer 5A, the first insulating layer 4 and the first conducting layer 3 are sequentially etched to expose sidewalls of the first insulating layer 4, of the etch protective layer 5A, and of the first conducting layer 3 and to form separated gate electrodes 3a and 3b and separated etch protective layers 5a and 5b on the gate electrodes 3a and 3b, respectively and to expose a portion of the gate oxide layer 2 positioned between the exposed sidewalls to define a source region 1A thereat. A second insulating layer 6 is deposited on the entire surface of the resulting structure including the source region 1A, the side walls of the gate electrodes 3a and 3b, the first insulating layer 4 and the etch protective layers 5a and 5b on the gate electrodes 3a and 3b. The second insulating layer 6 is etched to form a spacer 6a on each of the side walls of the gate electrodes 3a and 3b and on the first insulating layer 4 and to expose the source region 1A. A third insulating layer 7 is deposited on the entire surface of the resulting structure including the spacers 6a. The etching rate of the third insulating layer 7 is greater than the etching rate of the protective layers 5a and 5b. A contact region 10 is formed by selectively removing the third insulating layer 7, the gate oxide layer 2 on the source region 1A and portions of the third insulating layer 7 on the etch protective layers 5a and 5b by utilizing a contact mask patterning process thereby forming a contact region having an etch protected insulating layer.

The method according to the present invention may further include the step of performing a self-aligned contact process at the contact region to enable the source region 1A to be connected to a third conducting layer which is to be used as a bit line electrode.

The preferred embodiment includes the etch protective layer being polysilicon; the insulating layer 4 being an oxide layer; the second insulating layer 6 being an oxide layer; and/or the third insulating layer 7 being an inter poly oxide layer.

The etch protective layer 5A, the first insulating layer 4 and the first conducting layer 3 are, preferably, sequentially etched by a gate mask patterning process.

The second insulating layer 6 is preferably etched by a blanket etching process to form the spacers 6a.

The third insulating layer 7 and gate oxide layer 2 at the contact region are preferably over etched to make certain that the third insulating layer 7 and gate oxide layer 2 are completely removed from the contact region. This step makes certain a good electrical contact at the contact region.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

Figure 1:
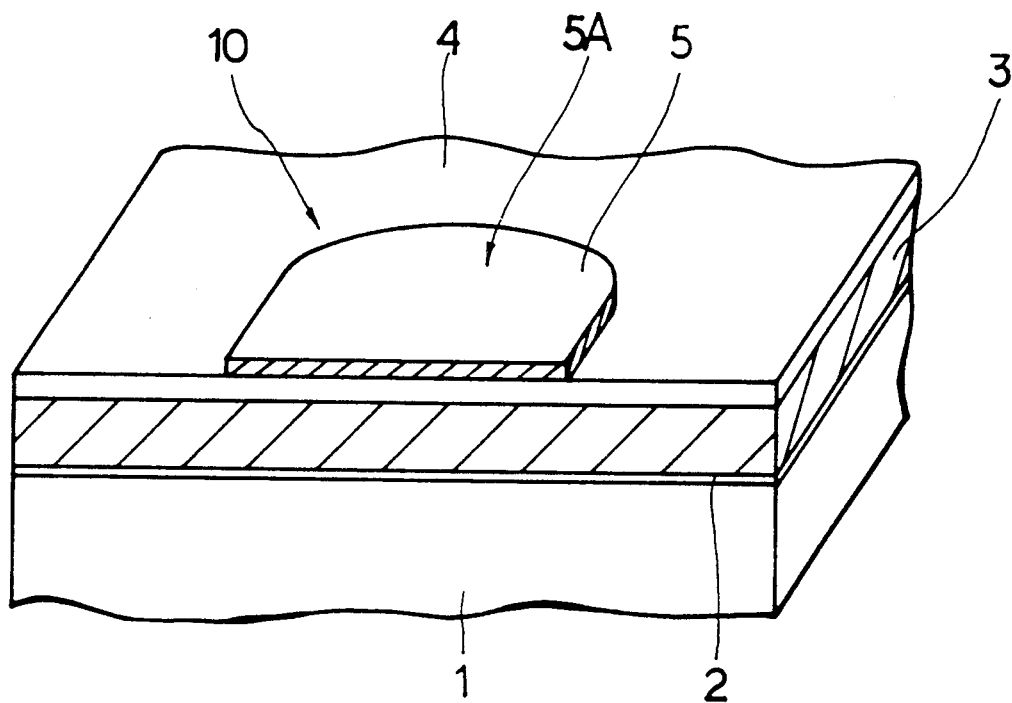
FIG. 1 through FIG. 6 illustrate sectional views for forming a self-aligned contact utilizing a polysilicon layer according to the present invention.

FIG. 1 shows that a gate oxide layer 2, a first conducting layer 3 for gate electrode, for example, a polysilicon, a first insulating layer 4 formed with an oxide and a second conducting layer 5 formed with polysilicon are sequentially deposited on a silicon substrate 1. A portion of the second conducting layer 5 is then etched to form an etch protective polysilicon layer 5A having a predetermined width at a portion defined as a contact region 10. The polysilicon layer 5A is a protective layer formed to prevent the first insulating layer 4, which is to be formed on gate electrode, from being etched during the contact etching process for contacting a bit line to a source region, which will be fully described hereinafter.

Figure 2:
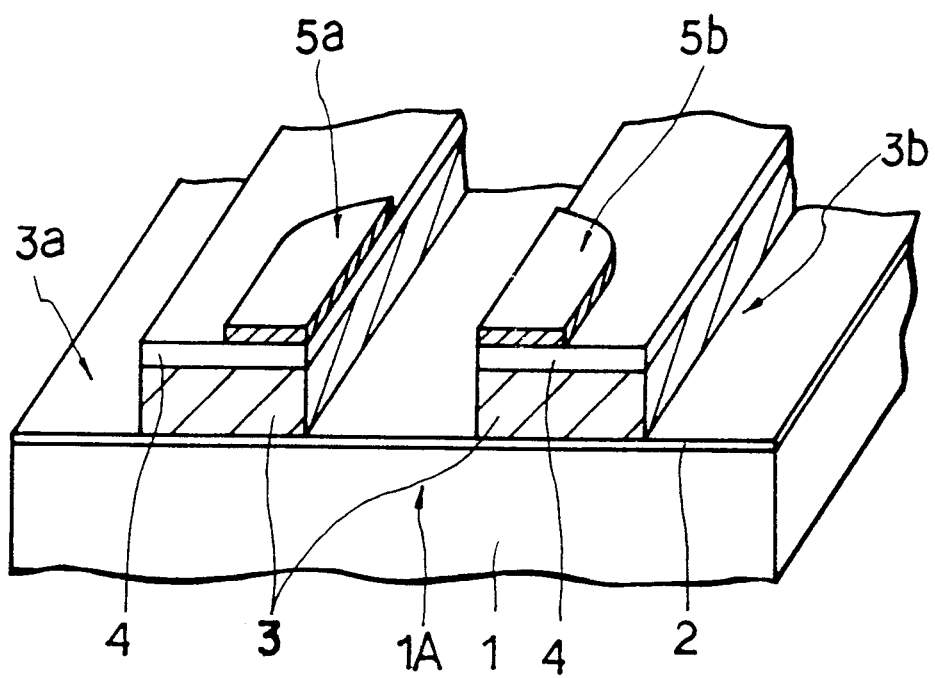

Referring to FIG. 2, by utilizing a gate mask patterning process, portions of the protective polysilicon layer 5A, the first insulating layer 4 and the first conducting layer 3 are sequentially etched to form gate electrodes 3a and 3b with each being separated from each other, so that protective layers 5a and 5b are partially formed on the gate electrodes 3a and 3b, respectively, as shown in the drawings. Here, a portion of the gate oxide layer 2 between the gate electrode 3a and 3b is exposed and a portion of the silicon substrate between the gate electrode 3a and 3b is referred to as a source region 1A hereinafter.

Figure 3:
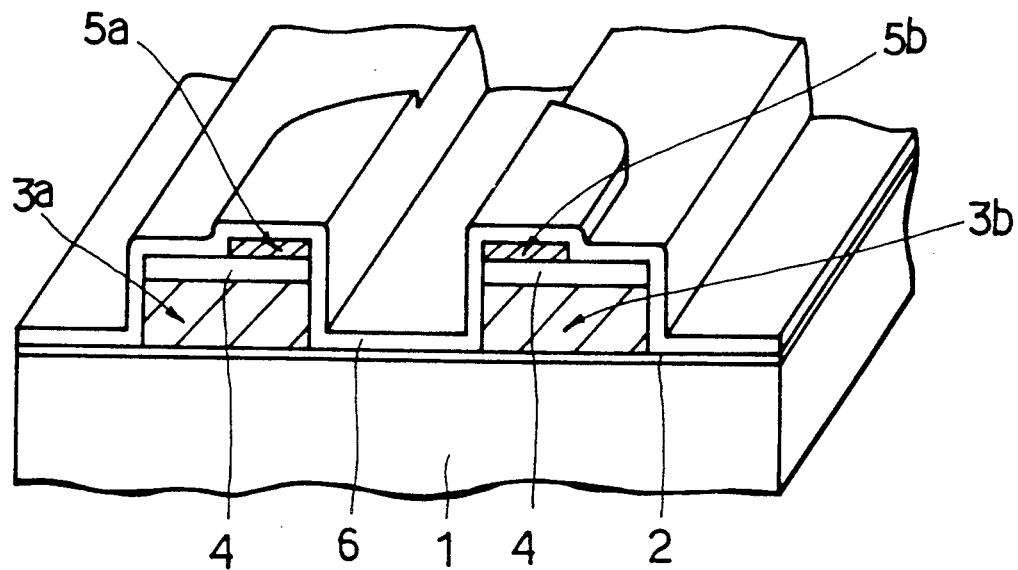

FIG. 3 illustrates that a second insulating layer 6 such as for example, an oxide layer, is deposited to a predetermined thickness on the entire surface of the resulting structure including the exposed portion of the gate oxide layer 2, the side walls of the gate electrodes 3a and 3b, the first insulating layer 4 and the protective layers 5a and 5b partially formed on the gate electrodes 3a and 3b.

Figure 4:
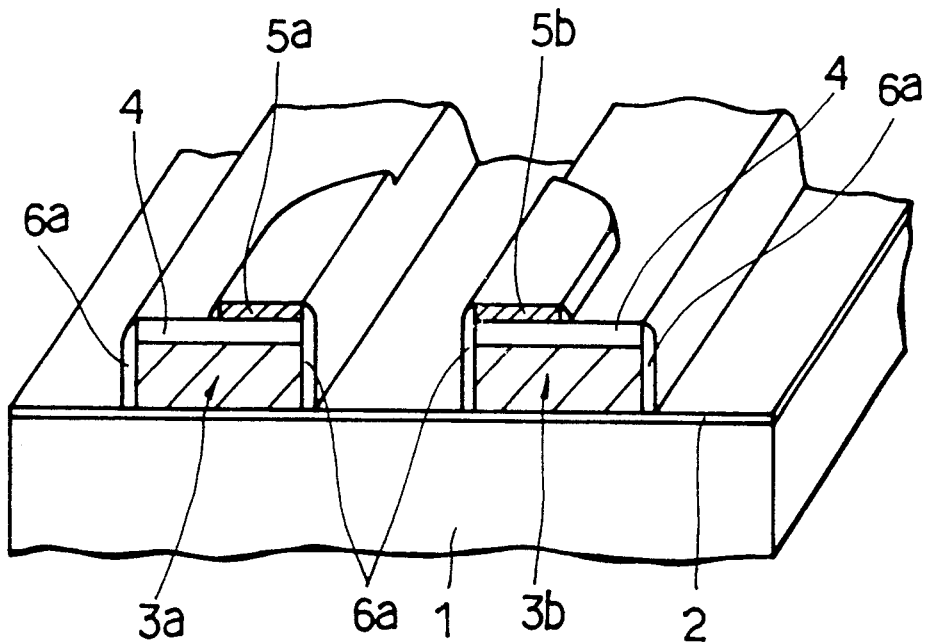

Referring to FIG. 4, the second insulating layer 6 is etched utilizing a blanket etching process to form spacers 6a on both side walls of the gate electrodes 3a and 3b and the first insulating layer 4. The reason why the spacers 6a are formed thereon is to insulate the gate electrodes 3a and 3b from a bit line which is to be formed later.

Figure 5:
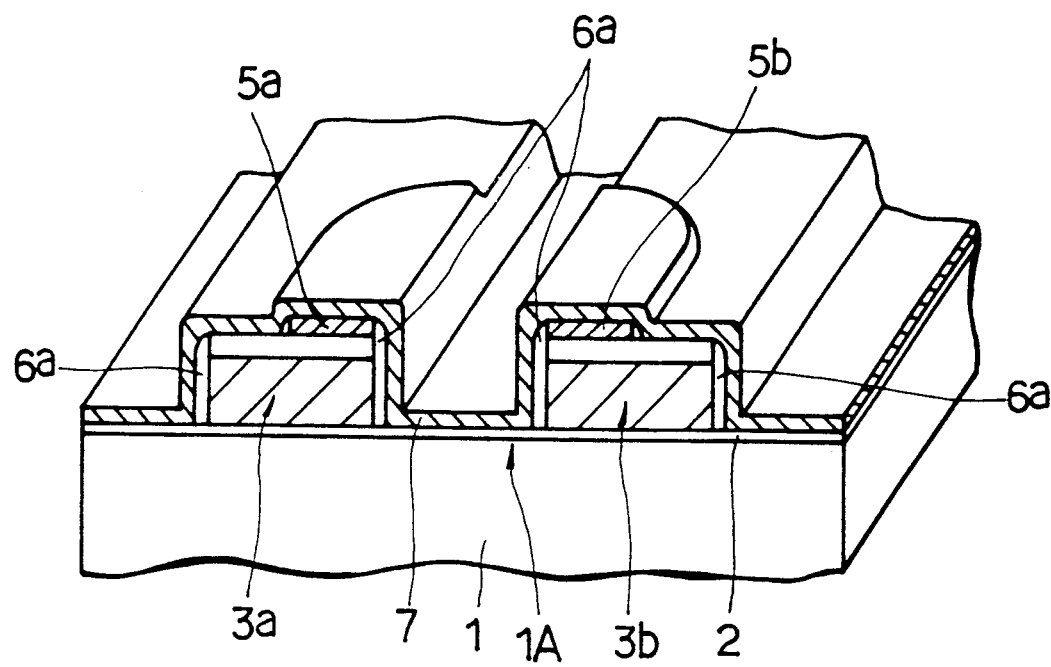

FIG. 5 shows that a third insulating layer 7, for example, an inter poly oxide layer, is deposited on the entire surface of the resulting structure formed in connection with FIG. 4.

Figure 6:
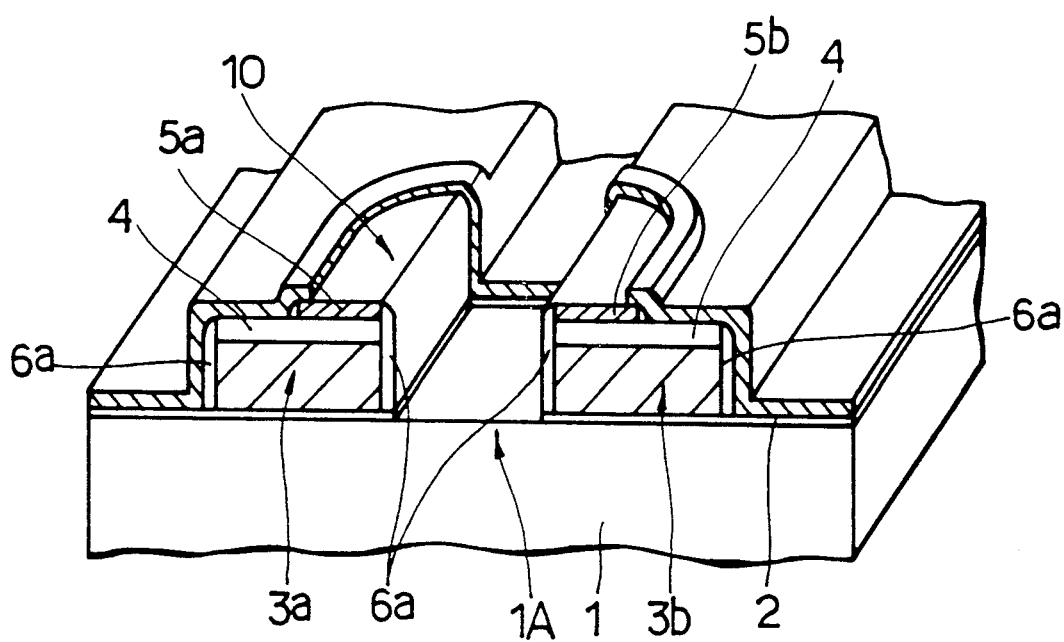

Referring to FIG. 6, by utilizing a self-aligned contact process, in order to connect the source region 1A of the silicon substrate 1 between the gate electrodes 3a and 3b to a third conducting layer 3 (not shown), for example, a polysilicon layer, which is to be deposited later and which is used as a bit line, a contact region 10 is formed by selectively removing both portions of the third insulating layer 7 and gate oxide layer 2 on the source region 1A and portions of the third insulating layer 7 on the protective layers 5a and 5b by utilizing the reactive plasma CF -O in a contact mask patterning process. Other etching agents which etch the oxide layer to a greater extent relative to the polysilicon layer which constitutes the protective layers 5a and 5b are known to those skilled in the art.

When over etching is required to completely remove the third insulating layer 7 and gate oxide layer 2 which may possibly remain on the source region 1A, the exposed protective layers 5a and 5b on the gate electrodes 3a and 3b are used as an etching barriers, since the etching selectivities of both the third insulating layer and the underlying protective layers are considerably different from each other. It is noted that the width of the contact region 10 should be smaller than that of the protective layer 5A. Therefore, when performing the etching process of the third insulating layer 7 and gate oxide layer 2 as mentioned above, if, for example, there are no protective layers 5a and 5b, the underlying first insulating layer 4 is then undesirably etched. This results in a current leakage between the gate electrodes 3a and 3b and the third conducting layer which is deposited later. Furthermore, if the first insulating layer 4 on the gate electrode 3a and 3b is considerably etched to the extent that the surface of the underlying gate electrodes 3a and 3b are undesirably exposed, an electrical short circuit is formed between the gate electrodes and the third conducting layer, which results in the failure of the device.

As described above, according to the present invention, by providing a protective layer on the gate electrode, when a contact etching process for connecting the conducting layer for bit line to the source region is performed, the over etching of the third insulating layer and gate oxide layer can be sufficiently accomplished, since the etching selectivities of the third insulating layer and protective layer are considerably different from each other. Thus, the insulating layer covering the gate electrode is protected from being etched during the contact etching process, so that the properties of the device are improved.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A method of forming a contact region having an insulating layer which is etch protected, said method comprises:

sequentially depositing a gate oxide layer 2, a first conducting layer 3 for gate electrode, a first insulating layer 4 and a second conducting layer 5 on a silicon substrate 1;

etching a portion of the second conducting layer 5 to form an etch protective layer 5A over a portion of the first insulating layer;

sequentially etching portions of the etch protective layer 5A, the first insulating layer 4 and the first conducting layer 3 to expose sidewalls of the first insulating layer 4, of the etch protective layer 5A, and of the first conducting layer 3 thereby forming separated gate electrodes 3a and 3b and separated etch protective layers 5a and 5b on the gate electrodes 3a and 3b, respectively and exposing a portion of the gate oxide layer 2 between the exposed sidewalls to define a source region 1A thereat;

depositing a second insulating layer 6 on the entire surface of the resulting structure including the source region 1A, the side walls of the gate electrodes 3a and 3b, the first insulating layer 4 and the etch protective layers 5a and 5b on the gate electrodes 3a and 3b;

etching the second insulating layer 6 to form a spacer 6a on each of the side walls of the gate electrodes 3a and 3b and on the first insulating layer 4 and to expose the source region 1A;

depositing a third insulating layer 7 on the entire surface of the resulting structure including the spacers 6a; and forming a contact region 10 by selectively removing the third insulating layer 7 and the gate oxide layer 2 on the source region 1A and portions of the third insulating layer 7 on the etch protective layers 5a and 5b by utilizing a contact mask patterning process thereby forming a contact region having an etch protected insulating layer thereat.

2. The process of claim 1 wherein the first and the second conducting layers are polysilicon layers.

3. The process of claim 1 wherein the insulating layer 4 is an oxide layer.

4. The process of claim 1 wherein the etch protective layer 5A, the first insulating layer 4 and the first conducting layer 3 are sequentially etched by a gate mask patterning process.

5. The process of claim 1 wherein the second insulating layer 6 is an oxide layer.

6. The process of claim 1 wherein the second insulating layer 6 is etched by a blanket etching process to form the spacers 6a.

7. The process of claim 1 wherein the third insulating layer 7 is an inter poly oxide layer.

8. The process of claim 1 wherein the third insulating layer 7 and gate oxide layer 2 at the contact region are over etched to make certain that the third insulating layer 7 and gate oxide layer 2 are completely removed from the contact region.

9. The process of claim 1 wherein the third insulating layer 7 and gate oxide layer 2 at the contact region are selectively etched by CF -O plasma.

10. A method of forming a contact region having an insulating layer which is etch protected, said method comprises:

sequentially depositing a gate oxide layer, a first conducting layer for gate electrode, a first insulating layer and a second conducting layer on a silicon substrate;

etching a portion of the second conducting layer to form an etch protective layer over a portion of the first insulating layer;

sequentially etching portions of the etch protective layer, the first insulating layer and the first conducting layer to expose sidewalls of the first insulating layer, of the etch protective layer, and of the first conducting layer by a gate mask patterning process thereby forming separated gate electrodes and separated etch protective layers on the gate electrodes, respectively, and exposing a portion of the gate oxide layer between the exposed sidewalls to define a source region thereat;

depositing a second insulating layer on the entire surface of the resulting structure including the source region, the side walls of the gate electrodes, the first insulating layer and the etch protective layers on the gate electrodes;

etching the second insulating layer by a blanket etching process to form spacers on each of the side walls of the gate electrodes and on the first insulating layer and to expose the source region;

depositing a third insulating layer having an etching rate which is greater than the etching rate of the protective layers on the entire surface of the resulting structure including the spacers; and forming a contact region by selectively etching the third insulating layer and the gate oxide layer on the source region and portions of the third insulating layer on the etch protective layers by utilizing a contact mask patterning process thereby forming a contact region having an etch protected insulating layer thereat with the third insulating layer and the gate oxide layer being over etched to make certain that the third insulating layer and gate oxide layer are completely removed from the contact region.

* * * * *